United States Patent [19]

Moulsley

[11] Patent Number: 5,233,349
[45] Date of Patent: Aug. 3, 1993

[54] TRANSMISSION AND DECODING OF TREE-ENCODED PARAMETERS OF ANALOGUE SIGNALS

[75] Inventor: Timothy J. Moulsley, Caterham, England

[73] Assignee: U.S. Philips Corporation, New York, N.Y.

[21] Appl. No.: 817,580

[22] Filed: Jan. 7, 1992

[30] Foreign Application Priority Data

Jan. 9, 1991 [GB] United Kingdom ............... 9100451
Apr. 2, 1991 [GB] United Kingdom ............... 9106785

[51] Int. Cl.$^5$ ............................................. H03M 7/00
[52] U.S. Cl. ................................................. 341/107
[58] Field of Search ............. 341/107, 106, 79, 51, 341/148, 155, 109; 364/960.5, 937.5, 938, 554

[56] References Cited

U.S. PATENT DOCUMENTS 4,042,927 8/1977 Helms ................................ 342/18
4,968,985 11/1990 Riggle et al. ..................... 341/106

Primary Examiner—Todd E. DeBoer
Assistant Examiner—Brian K. Young
Attorney, Agent, or Firm—David R. Treacy

[57] ABSTRACT

An analogue signal source (10) is coupled to an analyzer (12) to provide a plurality of parameters on a bus (14). The analyzer also provides a reset signal on a separate line (23) and both the bus (14) and the line (23) are fed to a tree coder (22). The reset signal is applied to the tree coder (22) before each parameter is applied on the bus (14) so that the coder commences from a known position in a coding tree for each parameter. The coded signals are supplied on a bus (24) to a modulator (28) having an output which is coupled to a transmitter (30). A system for recreating analogue signals coded in this way estimates partial values of parameters using the probability that each of the possible encoded sequences resulted in the signal from which the analogue signals are to be recreated. The recreating system may also use the probability of occurrence of each of the possible encoded sequences during the tree coding. This latter probability may be derived from the probability density function of the parameters. The tree coder may optionally be arranged to provide trellis coding, for example, for 8-PSK or 16QAM modulation.

12 Claims, 5 Drawing Sheets

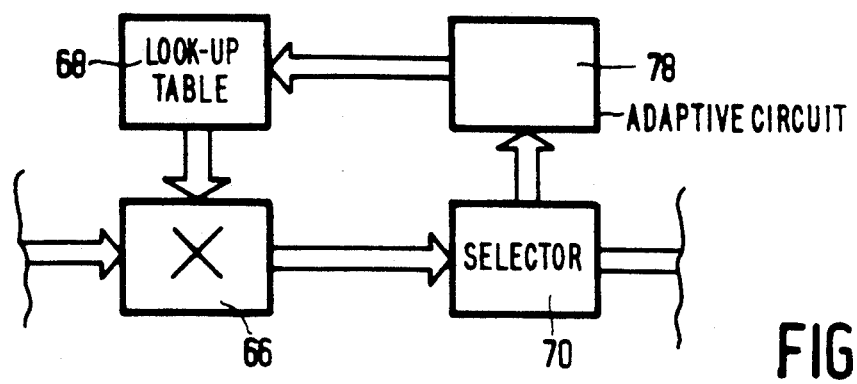
FIG.10
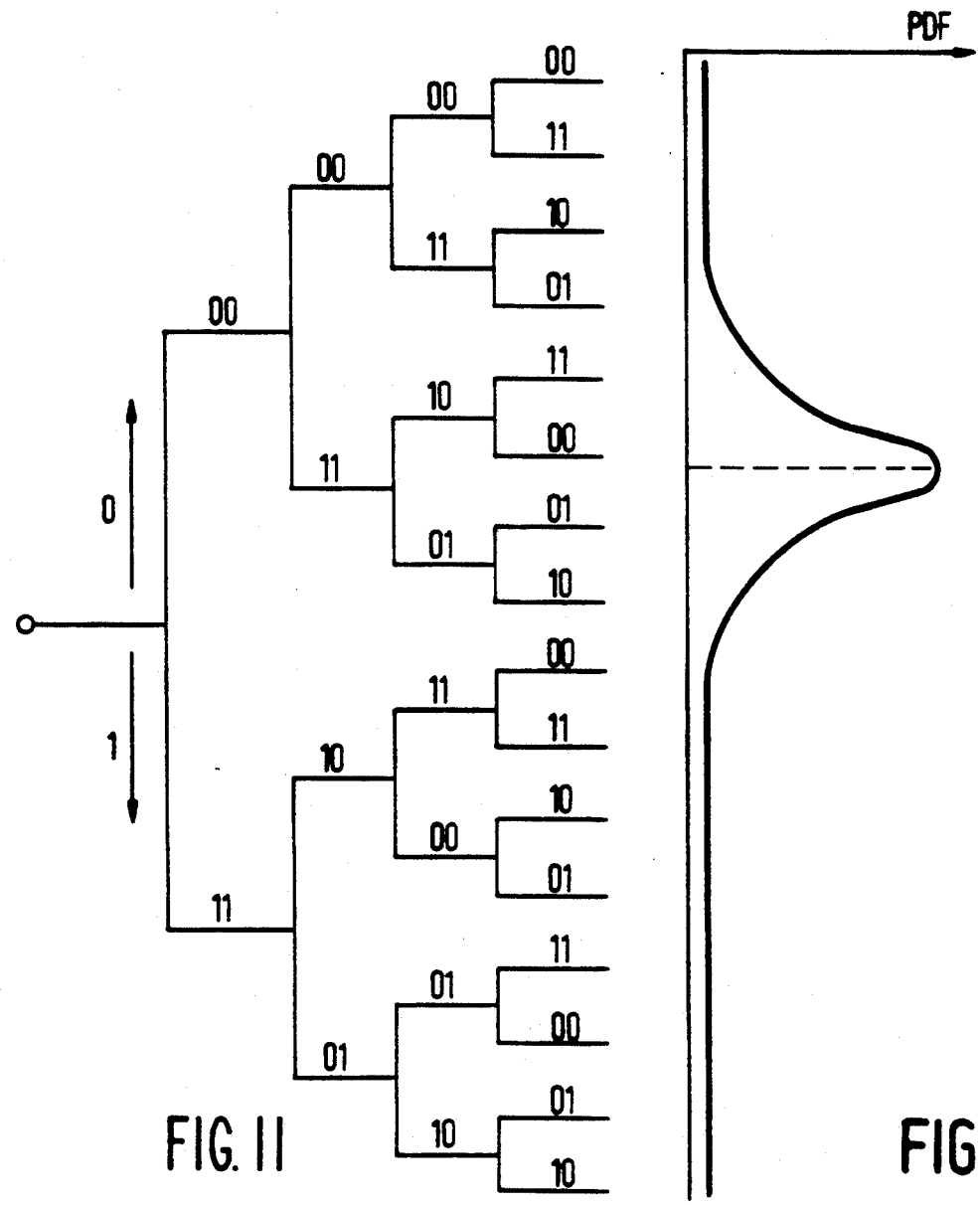
FIG.11
FIG.11A

TRANSMISSION AND DECODING OF TREE-ENCODED PARAMETERS OF ANALOGUE SIGNALS

BACKGROUND OF THE INVENTION

The present invention relates to a signal transmission system having particular, but not exclusive application to the transmission of digitised analogue signals over a channel. The invention also relates to a transmitter and receiver for use in the system and to encoding and decoding arrangements embodied in that transmitter and receiver.

When analogue signals are to be transmitted or stored in a digital format they can be converted by an analysis means to a digital data stream comprising a number of digital values representative of parameters of the analogue signal. Examples of such analysis means are well known and include vocoders, the Group Speciale Mobile (GSM) speech coder and code excited linear prediction (CELP) systems. At least some of the parameters provided by these systems can be regarded as digital representations of time varying analogue signals, for example the spectral coefficients of a vocoder or the gain parameter of a CELP system.

For simplicity of expression, the word "parameters" and the phrase "digitized parameters" will each be used in the following description and in the claims to refer not only to the parameters of the analogue signal which are or have been measured or sampled, but also to the digital values of these parameters after measuring or sampling and conversion to digital form. Parameters of this type generally comprise a number of binary bits of which the most significant bit (MSB) carries the largest weighting and the least significant bit (LSB) carries the smallest weighting. Consequently when the analogue signals are resynthesised from their digital representations an error for example, in the MSB of a parameter has a much greater subjective effect upon the perceived signal quality than an error in the LSB of that parameter. For example the least important or significant bits may only slightly reduce the quality of the signals, for example speech, as reproduced when subject to an error rate of say 5% while the most sensitive or significant bits will introduce serious distortion when subject to an error rate of say 1%.

In circumstances where errors are likely to be introduced in the transmission or storage of digitised analogue signals, some means of error protection, such as redundancy, is added to the digital representations of the parameters. This protection usually enables the correction of up to a given number of transmission errors at the receiver. By protecting a number of parameters together, unrelated binary sequences are represented by a stream of output bits from a coder and this can mean that potential flexibility in the decoding process is lost. Additionally, simple block codes have traditionally been used for this purpose but these provide an equal amount of protection for all of the binary bits which they are used to protect and, in view of the widely differing subjective effects of errors in different bits of the parameters this approach is not regarded as being the most cost effective. United Kingdom Patent Application GB 2 182 529 A describes a method of encoding speech whereby block codes, which are designed to provide greater protection for the MSBs than the LSBs of the parameters, are used to encode one parameter at a time. This Patent Application also discloses a method of recreating the analogue signals from digital representations which contain errors by the use of a number of different techniques, including the use of known characteristics of each parameter, the previously received values of each parameter and soft decision information. Block codes which are suitable for use with this method are, however, difficult to derive and separate block encoding means must be provided for every different length of binary bit sequence to be protected.

SUMMARY OF THE INVENTION

It is a first object of the present invention to provide a signal transmission system including a simpler means for coding analogue signals.

According to a first aspect of the present invention there is provided a signal transmission system comprising means for digitising an analogue signal to provide a plurality of digitised parameters, coding means for encoding at least the most significant bit of at least one parameter according to a tree code to provide an encoded sequence, means for resetting the coding means to a known point in a coding tree before another at least one parameter is encoded, means for combining the encoded bit(s) from the encoding system with the remaining bit(s) of the at least one parameter to provide a digitised signal, means for transmitting the digitised signal, means for receiving the digitised signal and supplying the signal to a probability determining means, means for generating a plurality of possible encoded sequences and for supplying the generated sequences to the probability determining means, the probability determining means being operable to provide a measure of the probability that each of the plurality of possible encoded sequences resulted in the encoded sequence and means for deriving from these measures of probability an estimated value of the parameter.

This system employs separate tree coding for each of the parameters which permits a less complex coder to be used than in a system, for example, where all of the parameters are coded together. The separate coding also enables greater flexibility in decoding since each coded parameter can be isolated from the others.

By further providing the coding means with the means to perform trellis coding, the error performance of the system may be improved. Trellis coding is known per se and is disclosed in a paper "Channel Coding with Multilevel/Phase Signals" by Gottfried Ungerboeck, IEEE Transactions on Information Theory, Vol. IT-28, No. 1, January 1982.

One means of performing tree coding is by convolutional coding, which may be performed by a shift register and combinational logic.

Where the number of bits produced by the encoding means, in other words the coding efficiency, is critical it may be desirable to encode only the most significant bits of certain parameters. The least significant bits of many parameters have a smaller subjective effect upon a resynthesised replica of the analogue signals than do the most significant bits. The least significant bits of those parameters will thus be without protection but a reduced symbol rate will be achieved. At a given data rate the transmission bandwidth may be reduced which could lead to increasing the number of time slots in a Time Division Multiple Access (TDMA) frame. The number of bits of each parameter which are coded may be fixed for that parameter or it may be variable, for example to compensate for levels of noise in a radio channel. An advantage of not tree or trellis coding all the data bits is that a receiver does not need to carry out the decoding over the whole bit stream. If for example it is assumed that the decoding is the dominant element in the receiver's power consumption, then by not coding all of the data bits, a power reduction of up to 60% can be obtained.

Several methods are available for digitising the analogue signals to be encoded, including vocoding, Code Excited Linear Prediction and the use of a Group Speciale Mobile speech coder.

The present invention also relates to the signal transmission and acquisition arrangements within the system.

It is a further object of the present invention to provide a simpler system for the encoding of digitised analogue signals.

According to a second aspect of the present invention there is provided an encoding system for encoding a digitised analogue signal comprising a plurality of parameters, the system comprising tree coding means, means for applying at least one most significant bit of at least one of the parameters to the tree coding means for supplying an encoded signal, and means for resetting the tree coding means to a known point in its coding tree before another at least one parameter is encoded.

By resetting the tree coding means before the next parameter is coded, the output of the tree coding means depends upon the value of that parameter alone and not upon any previous parameters. The resetting of the coding means will take different forms depending upon its realisation. For example, if the coding means is a convolutional coder comprising a shift register and a number of exclusive OR gates, then the resetting will comprise placing known values, typically zeroes, in the memory stages of the shift register.

Alternatively the tree coding means may be realised as a look-up table in which case the resetting will comprise removing the old parameter value from the inputs to the look-up table and applying a new value.

Where memory or transmission rate requirements are stringent only one or two most significant bits of a parameter are encoded and so a combining means is provided after the tree coding means to form an encoding system in which not all of the bits of each parameter are tree coded. The means for applying the parameters to the tree coding means may be provided with a first output at which one or more most significant bits are provided and a second output at which the least significant bits are provided. The first output is coupled to the input of the tree coding means and the combining means combines the output of the encoding system with the second output of the analysis means to give a composite output signal.

The number of bits supplied by the means for applying the parameters at its two outputs for a given parameter may be fixed or it may be variable, subject to the total number of bits in each parameter remaining constant.

If desired the tree coding means may be arranged to provide trellis coding.

It is a further object of the present invention to provide a corresponding system for estimating a parameter which has been encoded in accordance with the second aspect of the invention.

According to a third aspect of the present invention there is provided a system for estimating the value of a digitised parameter, at least the more significant bits of which have been tree coded to provide an encoded sequence, the system comprising means for supplying the encoded sequence to a probability determining means, means for generating a plurality of possible encoded sequences and for supplying the generated sequences to the probability determining means, the probability determining means being operable to provide a measure of the probability that each of the plurality of the possible encoded sequences resulted in the encoded sequence, and means for deriving from these measures of probability an estimated value of the parameter.

This system for estimating a parameter value, for example from a bit stream received over a radio channel, may be extended to exploit the individual tree or trellis coding of each of the parameters by also using the probability of occurrence of each of the possible encoded sequences during the coding to influence the estimating process. This probability will depend upon the type of analogue signals which have been encoded. By using this probability a received bit stream that corresponds closely to two or more parameter values may be estimated to be due to that parameter value which is most common.

At least two techniques are available to process the probability values derived from the first or the extended method. Firstly that parameter value having the highest probability of having been originally coded is selected, and secondly a weighted average of the probabilities of the occurrences of all possible parameter values may be taken.

Where only the most significant bit or bits are coded the estimating system will only be applied to these bits, a composite parameter value being provided by appending uncoded least significant bits to the estimated most significant bits.

The number of bits to be coded and hence subsequently estimated may be fixed or variable.

One method of deriving a measure of the probability of occurrence of each value of a given parameter is to measure the Hamming Distance of an encoded sequence from each of the possible values of that parameter and combining these Hamming Distances with a probability density function of the occurrence of these parameter values. This probability density function may be fixed or variable.

Additionally the encoded sequence may be used to provide soft decision information and/or channel state data such as bit error rate to adjust probabilities during the decoding process.

The present invention will be described, by way of example, with reference to the accompanying drawings:

BRIEF DESCRIPTION OF THE DRAWING

FIG. 10 is a block schematic diagram of an addition to the system shown in FIG. 8 to modify the probability density function for a given parameter, FIG. 11 shows a coding tree, FIG. 11a is another probability density function for a different parameter.

In the figures the same reference numerals are used to identify corresponding features.

DESCRIPTION OF THE PREFERRED EMBODIMENTS

Figure 1:
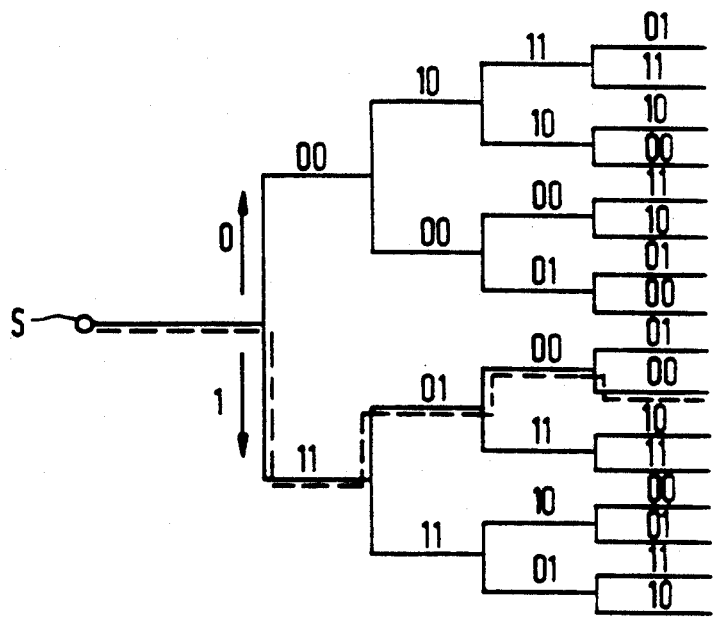
FIG. 1 shows a diagram of an arbitrary coding tree.

FIG. 1 shows a diagram of an arbitrary coding tree for a digital signal. To use the tree one follows a path through it from left to right and at each junction where a path splits into two, the path chosen is determined by the current input bit to the coder. Starting at the point S, if the incoming bit to be coded is a zero, the upper branch at each junction is followed and if the bit is a one the lower branch is followed. The outputs of the coder are shown on the branches of the tree. As each bit is fed to the coder a decision is made as to which branch to follow at the junctions and the coding progresses from left to right. For example, if the incoming bit stream is 1001b the path taken is shown by the dotted line in the figure and the output of the coder is 11010000b. It is important to realise that the coder output generated in response to an input bit is a function of that bit and previous input bits.

A tree coder can be realised as a look-up table or as a state machine. Generally the tree will repeat itself after a certain number of branches and the number of branches between repetitions determines the complexity of the coder.

A special type of tree coder is the convolutional coder which may be less complex to realise. Convolutional coding and decoding are described at page 680 et al. of "Modern Digital and Analogue Communications Systems" by B. P. Lathi, published by Holt and Saunders, 1983. A brief description of convolutional coding now follows with reference to FIG. 2. A digital signal comprising a serial stream of bits is fed via an input terminal 32 to a shift register 34 comprising three stages S1, S2, S3. The shift register 34 is clocked by a clock (not shown) at the same rate as the incoming serial data. The stage S1 contains the most recent bit fed to the shift register and this bit is fed simultaneously to a first input of an exclusive-OR gate 36 and to a first input of an exclusive-OR gate 38. The output of the stage S2 is the second most recent bit fed to the shift register and is coupled to a second input of the exclusive-OR gate 36. The output of the stage S3 is the third most recent bit fed to the shift register and is fed to a third input of the gate 36 and to a second input of the gate 38. The output of the gate 36 is available at a terminal 40 and the output of the gate 38 is available at a terminal 42. Each time a new input bit is fed to the terminal 32 a pair of convolutionally coded bits are available at the terminals 40,42 and these are generally sampled alternately to provide a convolutionally coded output.

Figure 2:
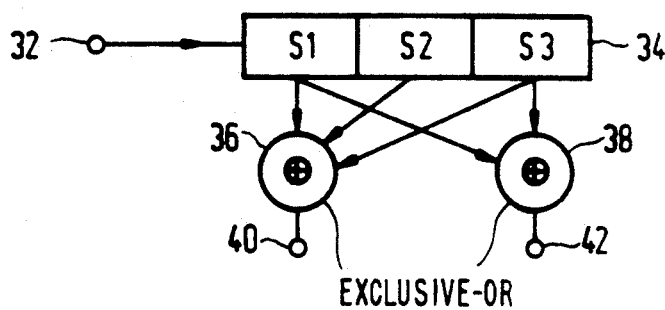
FIG. 2 shows a convolutional coder realised by a shift register and two exclusive-OR gates.
Figure 3:
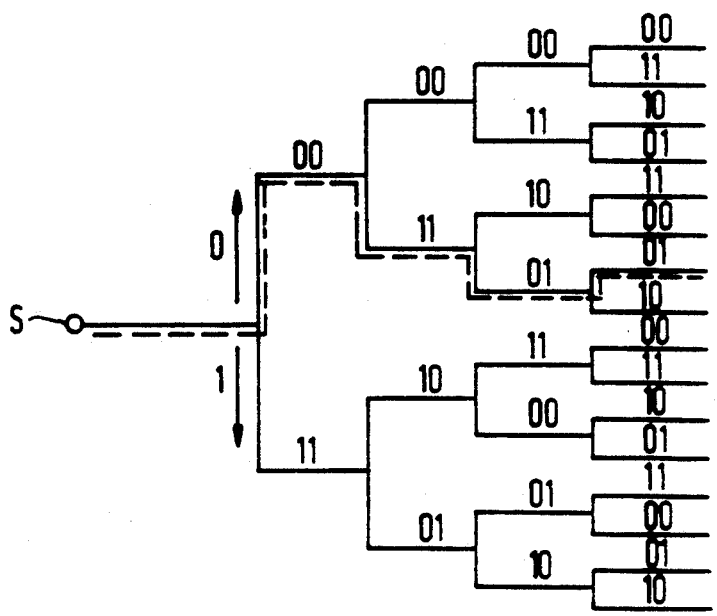
FIG. 3 shows a coding tree for the coder shown in FIG. 2.

The convolutional coding process may be shown as a coding tree as shown in FIG. 3. The tree is used in the same way as that of FIG. 1 and each branch is marked with the binary digits which are supplied at the coder output terminals 40,42 as each bit to be coded is fed to the input. For example the input bit sequence 0110b provides a series of output bits 00110101b by following the path marked in dotted lines on the tree. As can be seen, the gate 36 provides "exclusive-OR" operation by which, if more than one input is a "1", the output is zero. After the third set of nodes as one proceeds from left to right the tree begins to repeat itself which is not surprising since only three stages are provided in the shift register 34 (FIG. 2). The coder output is thus defined by the previous three input bits only. The construction of a convolutional coder has the effect that a stream of zero input bits will result in a stream of zero output bits, whereas in a more general tree coder this need not be the case.

Figure 4:
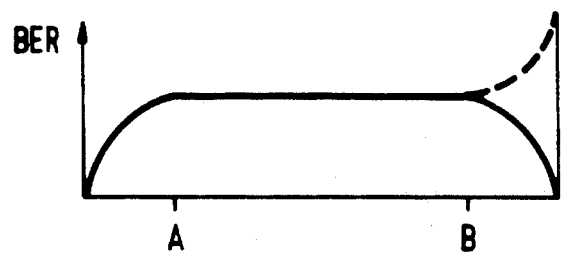
FIG. 4 is a graph illustrating the bit error rate performance of a convolutional coder.

FIG. 4 is a graph which illustrates the error correcting performance of a convolutional code in terms of the bit error rate (BER) of convolutionally coded signals subjected to random transmission errors. The horizontal axis represents the bits being coded with the first one on the left and the vertical axis represents the bit error rate. The convolutional coder is assumed to have been reset to a known state at the beginning of the coding so that the first few coded bits have a low but increasing BER. By point A after approximately 10 to 12 coded bits the BER curve levels off and remains substantially constant for successive bits. Since the decoding of a convolutional code relies upon subsequently received bits to reduce the BER of any given bit, for the last approximately 10 to 12 bits shown after the point B in the dotted curve the BER increases dramatically. To counter this the input 32 (FIG. 2) to the coder is fed with a number of known digits equal to the number of stages in the shift register after the last bit to be coded has been fed in. This provides a known state of the coder at the end of the coding process and causes the BER performance to follow the solid line shown in FIG. 4. The number of bits which have been coded at points A and B are approximate and will vary from coder to coder.

To encode an analogue signal in accordance with the present invention the signal is first digitised to provide a number of digital parameters which represent a section in time of the signal. These parameters are then tree coded individually to produce a coded section of bits within which each coded parameter is wholly separable from the others. The coded section of bits may then be transmitted or stored.

Figure 5:
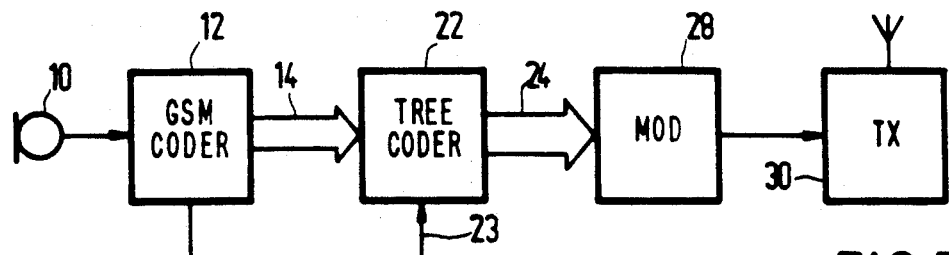
FIG. 5 is a block schematic diagram of a system for digitising analogue signals in accordance with the present invention.

FIG. 5 shows a transmission system for channel coding digitised signals in which the parameters are encoded individually and transmitted over a radio link. A source of incoming analogue signals, in this case a microphone 10, is coupled to an input to a Group Speciale Mobile (GSM) coder 12 which is operable to provide a set of parameters successively in time on a bus 14. In addition the GSM coder 12 provides a signal on a reset line 23 which signal is active at a point in time after each parameter has been made available on the bus 14. The bus 14 is coupled to a tree coder 22 to which the reset line 23 is also coupled. An output 24 from the coder is fed to a modulator 28 which supplies a modulated signal to a transmitter 30. The system operates to tree code and transmit each parameter generated by the GSM coder. Where, for example, the tree coder is a convolutional coder of the type shown in FIG. 2 the reset line 23 will be connected to the shift register to set the contents of S1,S2,S3 to known values—typically zeroes.

The coding means 22 (FIG. 5) can be realised as a look-up table when the number of bits to be coded together is relatively small. The coding tree shown in FIG. 3 may be implemented as a look-up table comprising a read only memory (ROM). In order to realise the coding algorithm shown in FIG. 3, the table requires four address lines and eight data lines, in other words a memory with sixteen, eight bit locations. The look-up table contains all the possible permutations of the coding tree, for example location address 0110b contains 00110101b. When this look-up table is used to code fewer than four bits the most significant address lines are supplied with the reduced number of bits and the output is taken from the most significant bits of the data lines.

Alternatively, the system shown in FIG. 5 may be used as a trellis coder. Trellis coding is known per se and is disclosed in a paper "Channel Coding with Multilevel/Phase Signals" by Gottfried Ungerboeck, IEEE Transactions on Information Theory, Vol. IT-28, No. 1, Jan. 1982. Such coding is applicable to 8 PSK and 16 QAM modulation systems and is described in detail subsequently.

While the digitising system shown in FIG. 5 includes a transmitter it will be understood that the output of the coder 22 could be fed to a wide variety of circuitry, for example a storage device, an optical fibre transmission means or a modem and telephone line.

Any parameter-based analogue signal analysis means could be substituted for the GSM coder 12, for example a vocoder or a Code Excited Linear Prediction coding system.

A method of recreating analogue signals which have been tree encoded in accordance with the above encoding method will now be described. An incoming bit stream is assumed to be a garbled version of the encoded signal and this bit stream is subdivided into sections which correspond to the encoded bits of each parameter. Each of these sections is then compared with all of the possible sequences which could have been produced for that parameter by the encoder. A measure, for example binary Hamming Distance or Euclidean Distance, is thus created of the likelihood that each of these possible sequences resulted in the section of the encoded signal and the most likely sequence chosen.

Knowledge of the behaviour of the particular parameter being estimated may also be used to decide which of the possible sequences is the most likely. This knowledge may take the form of a probability density function table which contains values corresponding to the likelihood of occurrence of each of the possible sequences. Thus two measures are now available of the likelihood of occurrence of each of the possible parameter values, the first dependent solely upon the section of the encoded signal which has, for example, been received over a radio link, and the second based upon parameter behaviour which depends upon the nature of the signal which has been encoded. These two measures of likelihood are then combined to provide an overall measure of likelihood for each possible encoded sequence. If these measures are probabilities then they can be combined by simple multiplication. These overall measures can then be used in at least two alternative ways, firstly the parameter value corresponding to the greatest likelihood value can be chosen or, secondly a weighted average parameter value can be calculated which is based upon all of the likelihood values. The following equation may be used to calculate the weighted average parameter value:

$$\hat{\chi} = \frac{\sum_{n=0}^{N-1} \chi \, P_r(\chi) \, P(\chi)}{\sum_{n=0}^{N-1} P_r(\chi) \, P(\chi)}$$

$\hat{\chi}$ is the weighted average parameter value, $\chi$ is a value of the parameter which can vary between 0 and $N-1$, $P_r(\chi)$ is the probability that the codeword corresponding to a parameter value of $\chi$ was transmitted, given the particular sequence of bits which has been received, $P(\chi)$ is the global probability that the codeword corresponding to a parameter value of $\chi$ was transmitted, based upon known characteristics, or previous behaviour of the parameter.

Figure 6:
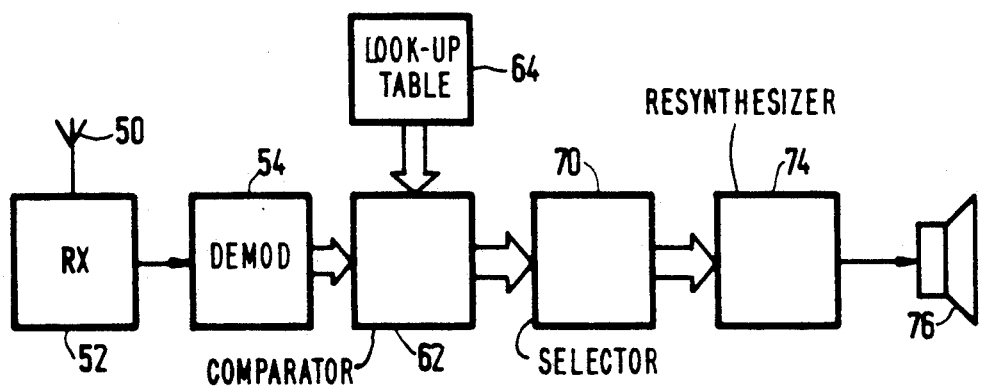
FIG. 6 is a block schematic diagram of a system for recreating analogue signals in accordance with the present invention.

FIG. 6 of the accompanying drawings shows a system for recreating analogue signals which have been tree encoded in accordance with the above encoding method described with reference to FIG. 5 and then transmitted over a radio link. A radio receiver 52 having an antenna 50 is coupled to a demodulator 54 which subdivides an incoming bit stream into sections corresponding to encoded parameters. An output of the demodulator 54, which output comprises an encoded parameter, is coupled to one input to a comparison means 62 which has a second input coupled to a look-up table 64. The look-up table 64 contains all of the possible encoded sequences for the parameter being received. The comparator 62 may include a Hamming Distance measuring means and is operable to provide a measure of the probabilities that the encoded section of bits which has been received was caused by each of the possible encoded sequences. The output of the comparator 62 is fed to a selection means 70 which is operable to select the most likely parameter value from the plurality of probability values. The output of the selection means is fed to a resynthesiser 74 which is coupled to an audio output transducer 76. The resynthesiser stores successive parameters supplied to it by the means 70 and when a complete set has been received it provides a synthetic replica of the analogue signal originally coded to the audio output transducer 76. The means 70 may be replaced by means for calculating a weighted mean and this means may operate in a manner analogous to the equation described above.

The comparator 62 may be arranged to exploit the tree structure of the coding process to almost halve its computational load. Instead of calculating the Hamming Distance in its entirety for each of the possible coder output sequences, the distance of the first two bits of the received section of coded bits from the two bits in each of the first two branches of the coding tree is measured. This process is repeated every time a codebook tree branch splits into two until a pair of bits representing the distance of the received bits from the coder output bits at every branch of the tree is obtained. All of the possible distances are then calculable by simple addition of all the distances at each branch of the tree.

Where the number of bits required to transmit or store the digitised analogue signals is important, the efficiency of the tree or trellis coding needs to be considered. Using a tree code which outputs two bits for every one bit supplied to its input the coding efficiency can never exceed 50%. Using a trellis coder which provides three bits for every two bits supplied to its input the coding efficiency can never exceed 67%. Since the digital parameter values comprise most significant bits which are more critical to the resynthesis of the analogue signals than their least significant bits it is possible to improve the coding efficiency per parameter by only encoding the most significant bit or bits of each parameter.

Figure 7:
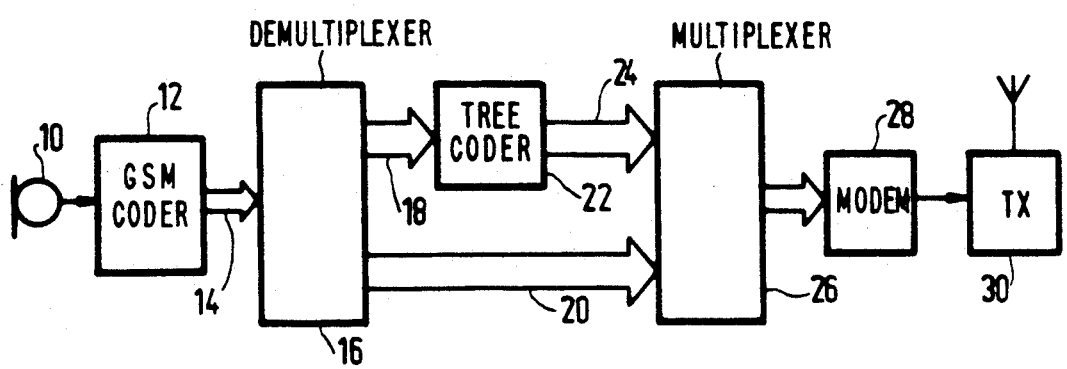
FIG. 7 is a block schematic diagram of another system for digitising analogue signals.

FIG. 7 shows a system for digitising analogue signals at a lower bit-rate than that of FIG. 5 and for transmitting the digitised signals via a radio link. A source of incoming analogue signals 10 is coupled to an input to a GSM coder 12 which is operable to provide a set of parameters successively in time on a bus 14. The bus 14 is coupled to a demultiplexer 16 which has two parallel digital output busses 18,20. The first of the digital outputs on the bus 18 comprises at least one most significant bit of each parameter and is fed to a tree coding means 22 which may be realised as a sequential circuit or as a look-up table. An output from the coding means 22 is fed via a bus 24 to a multiplexer 26. The multiplexer 26 is also fed with the remainder of the bits of each parameter from the output 20 of the demultiplexer 16. The demultiplexer 16 may simply comprise the separation of a multibit bus into two sets of digital bits and the multiplexer 24 may comprise the combination of two sets of digital bits to give a composite signal. An output of the multiplexer 26 is fed to a modem 28 whose output is fed to a transmitter (Tx) 30.

In the system shown in FIG. 7 the GSM coder 12 provides a set of digital parameters which are shown below together with their length in bits and one possible allocation for the number of bits of each which are fed to the coder 22 by the demultiplexer 16. In the table, LAR stands for Log Area Ratio and LTP stands for Long Term Predictor. LAR1 to LAR8 are reflection coefficients transformed to Log Area Ratios. The long term predictor, often referred to as the pitch predictor, computes optimum values of a loop gain and delay for minimising the residual signals within the GSM coder.

| GSM parameter | No. of bits | No. of bits coded |
|---|---|---|
| LAR 1 | 6 | 5 |
| LAR 2 | 6 | 4 |
| LAR 3 | 5 | 3 |
| LAR 4 | 5 | 3 |
| LAR 5 | 4 | 3 |
| LAR 6 | 4 | 2 |
| LAR 7 | 3 | 2 |
| LAR 8 | 3 | 1 |
| LTP lag | 7 | 7 |
| LTP gain | 2 | 2 |
| Block Amplitude | 6 | 5 |

Each of the parameters is coded separately and the coder 22 (FIG. 7) is reinitialised to a known point in the tree before the most significant bits to be coded are fed to it. This reinitialisation is performed upon all of the stages of the shift register at once and no outputs are taken from the terminals 40,42 (FIG. 2). The most significant bit of each parameter is coded first, followed by the second most significant bit, followed by the third most significant bit and so on. Referring to the BER graph shown in FIG. 4, coding the bits in this order gives the most significant bit the most protection and decreasing amounts of protection for the less significant bits. Since the maximum number of bits coded for any one parameter is 7 the point A on the graph shown in FIG. 4 is never reached and so in this case the BER remains below its maximum value.

Figure 8:
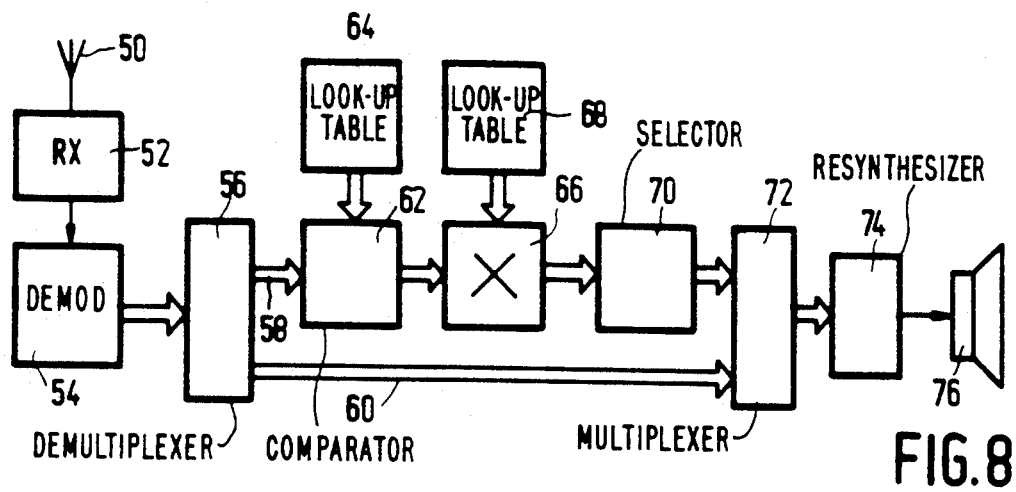
FIG. 8 is a block schematic diagram of another system for recreating analogue signals.

FIG. 8 shows a system for recreating a synthetic version of an analogue signal which has been digitised and channel coded by a system such as that shown in FIG. 7. A radio signal received at an antenna 50 is fed to a receiver (Rx) 52 having an output which is coupled to a demodulator 54. The output of the demodulator 54 is a serial stream of binary digits which is fed to a demultiplexer 56. The demultiplexer comprises a shift register to convert the serial binary data to a parallel format and to feed the tree coded section of each parameter on an output bus 58 to a comparator 62. The least significant bit or bits of each parameter which have not been tree coded are fed by the demultiplexer 56 on an output bus 60 to a multiplexer 72. The comparator 62 is also coupled to a coding means 64, which may comprise a look-up table. The purpose of the means 64 is to regenerate all the possible bit streams generated by the coding means 22 (FIG. 7). The comparator 62 is operable to measure the Hamming Distance, that is the number of bits which differ, between the received section of convolutionally coded bits and every possible sequence which the convolutional coder 22 (FIG. 7) could have produced. The Hamming Distances between the received section of coded bits and the coder sequences can be converted to a set of probabilities that each possible sequence is the one that was transmitted and this conversion to a probability may make the subsequent processing easier. Each of the possible sequences has a corresponding binary data value which is a possible value of the coded relevant section of a parameter. These Hamming Distances or their respective probabilities are then multiplied in a multiplier 66 by a value corresponding to the probability of the occurrence of that binary data value to which the coded sequence supplied by the means 64 corresponds. These probability values are held in a look-up table 68 whose output is fed to the multiplier 66. To reduce the computation required at this stage those parameter values having Hamming Distances of greater than a given value need not be fed to the multiplier 66. The output of the multiplier is fed to a selection means 70 which selects the lowest product of Hamming Distance and the probability of the occurrence of the binary data value.

The selection means 70 could, for example, comprise a store means and a comparison means, for example a subtractor. The store means initially stores the first output of the multiplier 66 for a particular parameter. The output value held in the store means is then compared in the subtractor with the next output from the multiplier 66 and if this next value is lower than the one held in the store means then this next value is placed in the store means. This process is repeated until all the possible sequences have been compared. The binary data sequence which corresponds to the lowest Hamming Distance or greatest probability product is fed to the multiplexer 72. The multiplexer 72 is also supplied with the non-tree coded bits on a bus 60 and the output of the multiplexer is fed to a resynthesiser 74. The resynthesiser is also supplied with further parameters received and decoded by the system and provides a synthetic output signal to an output device such as a loudspeaker 76.

Figures 9, 9A:
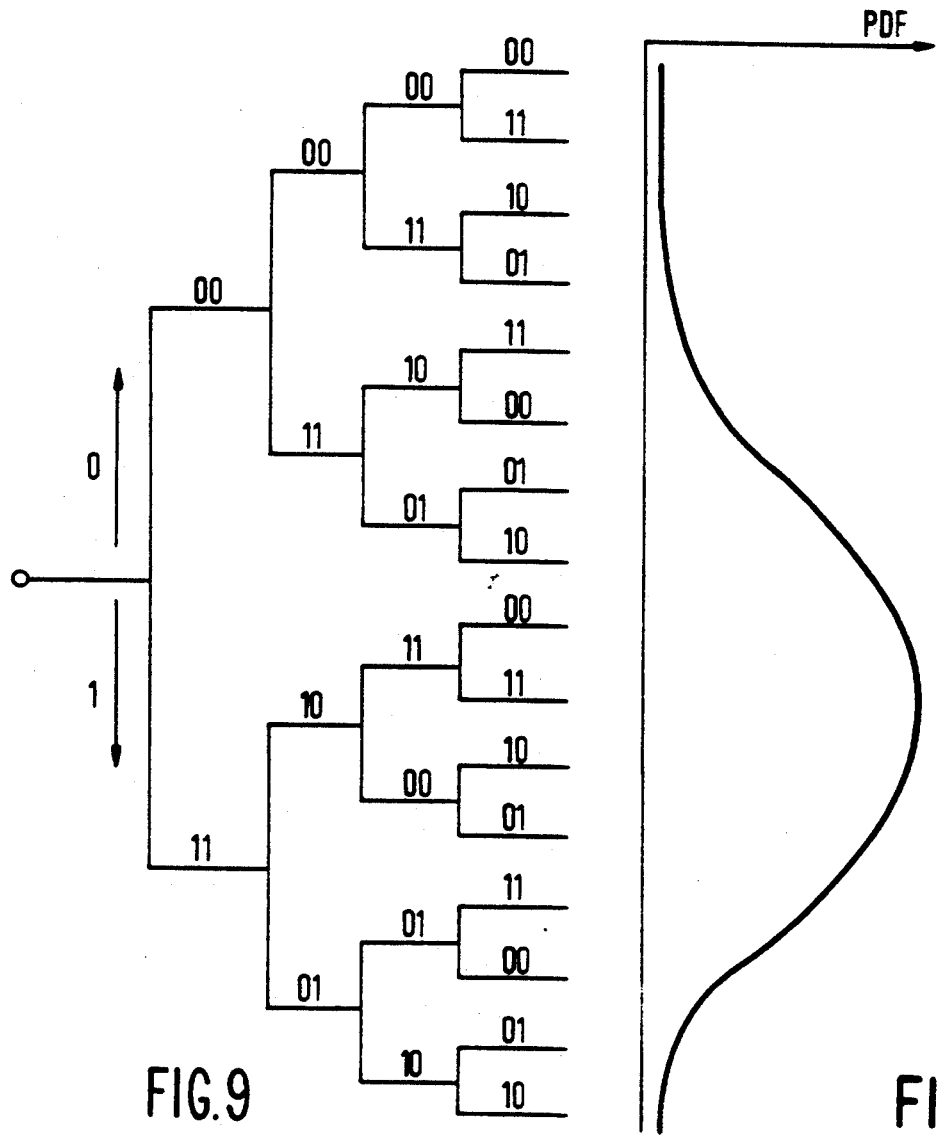
FIG. 9 shows a coding tree.
FIG. 9a is probability density function for a given parameter.

FIG. 9 shows a coding tree and FIG. 9a is a graph of a probability density function (PDF) for the most significant bits of a parameter which have been coded using the tree. While the graph is shown as a smooth curve it will be understood that the PDF will be stored by the look-up table 68 (FIG. 8) as a set of discrete values. From the graph it can be seen that a value of the coded parameter of around 1001b is comparatively likely while a value of around 1111b is comparatively unlikely. This has the effect that when a received section of bits has a Hamming distance of, for example, three from a coding tree sequence which corresponds to a parameter value of 1001b it may have a lower Hamming Distance and probability product than a received section of bits having a Hamming Distance of one from a coding tree sequence corresponds to a parameter value of 1111b.

The probability density function stored in the look-up table 68 (FIG. 8) can be derived in at least two different ways. It could be a permanent read only memory (ROM) look-up table which contains values appropriate to the particular parameter of the analogue signals currently being recreated by the system. Alternatively the look-up table 68 could be an adaptive look-up table whose contents are altered during the operation of the system. FIG. 10 shows a portion of the system shown in FIG. 8 in which an adaptive means 78 has been coupled between an output of the selection means 70 and the look-up table 68. The means 78 is operable to alter the contents of the look-up table 68 based upon the current, and perhaps also previous, outputs from the selection means. The degree of the alteration may be varied from a slight change, for example a sharpening of the peak in the PDF graph, to a more drastic change in which a sharp peak is placed in the PDF graph centred upon the previous output of the means 70. FIG. 11a gives an example of such a sharp peak in the PDF curve, centred upon a parameter value of 0101b for the tree of FIG. 11. It is important not to allow the PDF curve to have a zero value anywhere because this may prevent a perfectly matched (zero Hamming Distance) sequence of received bits from being selected by the means 70. This sharp PDF curve may be particularly appropriate for recreating speech because it reduces the probability of the received parameter values from making wild excursions due to corrupted bits. The use of probability density functions in this manner can also be applied to the recreating system shown in FIG. 6.

Figure 12:
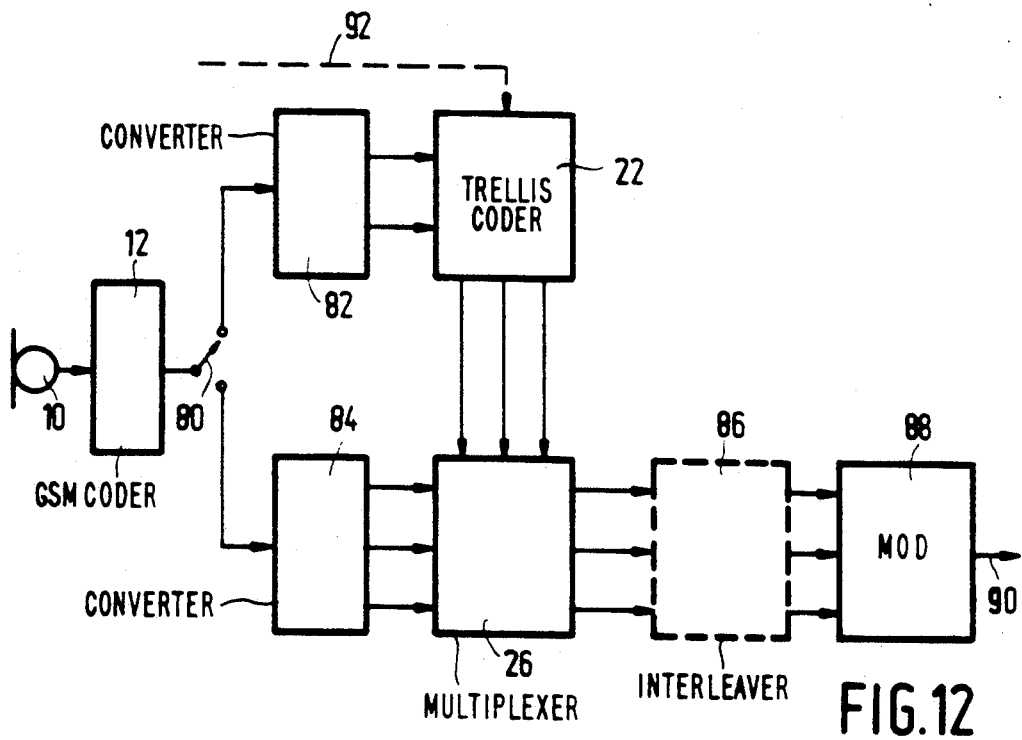
FIG. 12 is a block schematic diagram of a trellis coder for 8-PSK.

FIG. 12 shows a system for applying trellis coded modulation using 8 phase shift keying (TCA-8PSK) to the most significant bits of parameters provided by a speech coder. In the Figure, the transmitter includes a microphone 10 which is connected to a speech coder 12 for example a GSM speech coder. The digitised speech is supplied in a serial stream to a switch 80 which is activated on a bit by bit basis to connect those bits which are to be protected to a serial to parallel converter 82 and those bits which are to be left unprotected to a serial to parallel converter 84. The output of the converter 82 is taken 2 bits at a time and applied to a trellis encoder 22 which may be implemented as a DSP (digital signal processor), microprocessor or a dedicated gate array. The three bit parallel output of the trellis encoder 22 together with a three bit parallel output from the converter 84 are multiplexed in a multiplexer 26. The output from the multiplexer 26 is supplied to an 8PSK modulator 88, optionally by way of an interleaver 86. The output 90 of the modulator 88 is applied to a radio channel. In the case of a TDMA system the output comprises a codeword having appended synchronisation and address bits, which codeword occupies a particular time slot or physical channel in a TDMA frame.

The trellis encoder 22 is also provided with a reset line 92 which resets the encoder to the beginning of the next parameter to be encoded. TCM-8PSK uses a ⅔ rate code applied to the basic 8PSK modulation. Thus the corresponding net data ratio are 2 bits per symbol for the encoded bits and 3 bits per symbol for the uncoded bits.

Optionally the modulator may be a 16QAM modulator in which case it will be necessary to have a ¾ rate code applied to the 16QAM modulation. Thus the corresponding net data rates are 3 bits per symbol for the encoded bits and 4 bits per symbol for the uncoded bits. This means that there will be 3 parallel output bits from the converter 82 and 4 parallel output bits from the converter 84.

Figure 13:
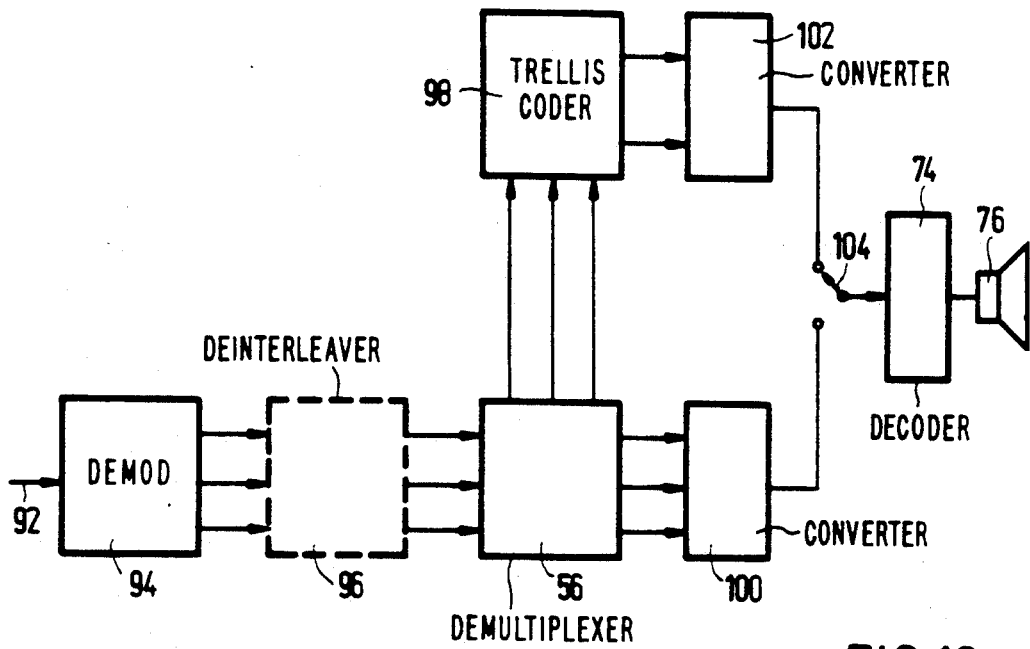
FIG. 13 is a block schematic diagram of a decoder for use with the coder shown in FIG. 12.

FIG. 13 shows a receiver which in essence is the reciprocal of the transmitter shown in FIG. 12. A recovered codeword on an input 92 is applied to either an 8PSK or a 16QAM demodulator 94, the parallel outputs from which are applied to a demultiplexer 56, if necessary, by way of a deinterleaver 96. The trellis encoded bits are supplied to a trellis decoder 98 which may incorporate a Viterbi algorithm and the uncoded bits are supplied to a parallel to series converter 100. The 2 bit (or 3 bit) outputs of the trellis decoder 98 are applied to a parallel to serial converter 102. The outputs of the converters 100, 102 are applied to respective poles of a change-over switch 104 which is capable of being operated on a bit by bit basis. The switch 104 is so controlled that the more and less significant bits are assembled correctly for speech decoding in a speech decoder 74 to form an analogue signal which is applied to an audio output transducer 76.

By encoding only the more significant bits of the digitised speech, the receiver need only decode those symbols representative of the trellis encoded digitised speech which saves an appreciable amount of power, up to 60%.

Soft decision information may also be used in the signal recreating systems shown in FIGS. 6, 8 and 13. This well known technique involves the making of a weighted decision on each received bit at the demodulator. The output from the demodulator will then be a probability value for each bit rather than a one or a zero as it would be in a so called hard decision. One way of handling this information allows the Hamming Distance from the received section of coded bits to take a non-integer value. The multiplier 66 and the selection means 70 of FIG. 8 must therefore be capable of working with non-integer values. Otherwise the system behaves exactly as previously described and the parameter value can either be selected or made equal to a weighted average. There may also be an advantage in making a soft decision on the uncoded least significant bits of any parameter if extra information such as a probability density function for them is available.

Alternative means for the decoding of the convolutionally coded bits could be used, for example Viterbi minimum distance decoding, but in the first system described above the parameters from the analysis of the incoming analogue signal are all encoded separately and will seldom comprise more than 10 bits which allows an exhaustive search of the coding tree by the means 70

(FIG. 6) to be performed quickly. In addition it is difficult to take account of probability density functions when using Viterbi decoding as it is intended to decode blocks of bits in which each bit has an equal weighting.

From reading the present disclosure, other modifications will be apparent to persons skilled in the art. Such modifications may involve other features which are already known in the design, manufacture and use of signal transmission systems, and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A signal transmission system, comprising:
means for digitizing an analogue signal to provide a digital data stream comprising a plurality of digitized parameters,
coding means for encoding at least the most significant bit of at least one of said digitized parameters according to a tree code, to provide a respective encoded sequence,
means for resetting the coding means to a known point in a coding tree before the next of said digitized parameters is encoded,
means for combining at least said encoded sequences to form a digitized signal representative of said analogue signal,
means for transmitting said digitized signal,
a probability determining means,
means for receiving the digitized signal and supplying said digitized signal to said probability determining means,
means for generating a plurality of possible encoded sequences and supplying said possible encoded sequences to said probability determining means, said probability determining means being arranged for determining the respective probability values that individual ones of said plurality of possible encoded sequences resulted in said respective encoded sequence, and
means for deriving an estimated value of said at least one of said digitized parameter from said probability values.

2. A system as claimed in claim 1, comprising a probability density function determining means for providing a measure of the probability of occurrence of each of the plurality of possible encoded sequences during encoding by said means for encoding, and a probability combining means for combining a measure of probability from both the probability determining means and the probability density function determining means, and for supplying a signal to said means for deriving.

3. A system as claimed in claim 2, characterized in that said means for encoding retains at least the least significant bits of said digitized parameters unencoded, and
said means for combining combines the encoded bits with unencoded bits remaining of said at least one of said digitized parameters to provide said digitized signal.

4. A system as claimed in claim 3, characterized in that said means for encoding provides a trellis encoded sequence for combination with the retained least significant bits of said at least one of said digitized parameters.

5. A system as claimed in claim 1, characterized in that said means for encoding retains at least the least significant bits of said digitized parameters unencoded, and
said means for combining combines the encoded bits with unencoded bits remaining of said at least one of said digitized parameters to provide said digitized signal.

6. A system as claimed in claim 5, characterized in that said means for encoding provides a trellis encoded sequence for combination with the retained least significant bits of said at least one of said digitized parameters.

7. An apparatus for producing an encoded digitized signal representative of an analogue signal, comprising
means for digitizing said analogue signal to provide a digital data stream comprising a plurality of digitized parameters,
coding means for sequentially encoding at least the most significant bit of one of, and of the next of, said digitized parameters according to a tree code, to provide respective encoded sequences,
means for resetting the coding means to a known point in a coding tree after encoding said one of, and before encoding said next of, said digitized parameters, and
means for combining at least said encoded sequences to form an encoded digitized signal representative of said analogue signal.

8. An apparatus as claimed in claim 7, characterized in that said means for encoding retains at least the least significant bit of said one of said digitized parameters unencoded, and
said means for combining combines the encoded bits with the unencoded bits remaining of said one of said digitized parameters to provide said digitized signal.

9. An apparatus as claimed in claim 8, characterized in that said means for encoding encodes at least the most significant bit of each of said digitized parameters, said encoding means being reset to said known point after each respective encoding of successive ones of said digitized parameters.

10. An apparatus for decoding an encoded digitized signal representative of an analogue signal, said digitized signal including a plurality of tree encoded sequences, each sequence representing at least the most significant bit of a respective parameter of said analogue signal, comprising
a probability determining means,
means for receiving the digitized signal and supplying said digitized signal to said probability determining means,
means for generating a plurality of possible encoded sequences and supplying said possible encoded sequences to said probability determining means, said probability determining means being arranged for determining the respective probability values that individual ones of said plurality of possible encoded sequences resulted in the encoded sequence corresponding to a given parameter of said analogue signal, and means for deriving an estimated value of said at least one of said digitized parameters from said probability values.

11. An apparatus as claimed in claim 10, comprising a probability density function determining means for providing a measure of the probability of occurrence of each of the plurality of possible encoded sequences during encoding, and a probability combining means for combining a measure of probability from both the probability determining means and the probability density function determining means, and for supplying a signal to said means for deriving.

12. An apparatus as claimed in claim 11, characterized in that said digitized signal includes at least the least significant bits of at least one of said digitized parameters unencoded.

* * * * *